(12) United States Patent
Dubey et al.

(10) Patent No.: US 11,777,489 B1
(45) Date of Patent: Oct. 3, 2023

(54) VOLTAGE SENSING AND BIASING FOR WIDE SUPPLY RANGE INTEGRATED CIRCUIT TRANSCEIVERS

(71) Applicant: Xilinx, Inc., San Jose, CA (US)

(72) Inventors: Hari Bilash Dubey, Hyderabad (IN); Milind Goel, Faridabad (IN); Venkata Siva Satya Prasad Babu Akurathi, Hyderabad (IN); Sabarathnam Ekambaram, Secunderabad (IN); Sasi Rama Subrahmanyam Lanka, Challapalli (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/747,387

(22) Filed: May 18, 2022

(51) Int. Cl.
*H03K 17/22* (2006.01)
*H03K 17/10* (2006.01)
*H03K 19/00* (2006.01)
*H03K 19/003* (2006.01)

(52) U.S. Cl.
CPC ......... *H03K 17/223* (2013.01); *H03K 17/102* (2013.01); *H03K 19/0013* (2013.01); *H03K 19/00315* (2013.01)

(58) Field of Classification Search
CPC .............. H03K 17/102; H03K 17/223; H03K 19/0013; H03K 19/00315; G06F 13/4282
See application file for complete search history.

(56) References Cited

U.S. PATENT DOCUMENTS

| | | | | |
|---|---|---|---|---|
| 5,179,297 | A * | 1/1993 | Hsueh | H03K 17/102 327/542 |
| 6,646,844 | B1 * | 11/2003 | Matthews | G06F 1/28 327/143 |
| 6,970,024 | B1 * | 11/2005 | Reese | H03K 19/00315 327/112 |
| 10,484,041 | B2 | 11/2019 | Ekambaram et al. | |

* cited by examiner

*Primary Examiner* — Ryan Johnson
*Assistant Examiner* — Colleen J O Toole
(74) *Attorney, Agent, or Firm* — Crawford Maunu PLLC

(57) ABSTRACT

A disclosed circuit arrangement detects the supply voltage level to the "device" (SoC, chip, SiP, etc.) and adjusts bias voltages to receiver and transmitter circuits of the device to levels suitable for the device in response to the supply voltage ramping-up during a power-on reset ("POR") sequence. The circuitry holds the receiver output at a constant logic value while the supply voltage is ramping up and the POR signal is asserted. The disclosed circuitry also protects the transceiver as the voltage domain of the input signal is unknown and the voltage between any two terminals of a transistor of the transceiver cannot exceed a certain level.

20 Claims, 12 Drawing Sheets

VOLTAGE SENSING AND BIASING FOR WIDE SUPPLY RANGE INTEGRATED CIRCUIT TRANSCEIVERS

TECHNICAL FIELD

The disclosure generally relates to detecting supply voltage levels and providing suitable biasing to integrated circuit transceivers.

BACKGROUND

Input/output (IO) circuits in an integrated circuit (IC) can support a variety of IO standards, requiring a wide supply range. Advancements in IC fabrication technologies have resulted in IO transistors that have lower voltage limits across any two terminals of the transistors. Thus, it is becoming increasingly challenging to design IO circuits that can accommodate multiple IO standards across a wide supply range. One technique to address this challenge is to divide the wide supply range into high voltage and low voltage ranges. Two different data paths can be used to drive the IO pad in the high-voltage and low-voltage modes.

SUMMARY

A disclosed circuit arrangement includes a biasing circuit configured to generate a final pbias voltage, a final nbias voltage, and a sense signal in response to a supply voltage level. In response to the supply voltage level being greater than the reliability limit of transistors of the biasing circuit, the final nbias voltage is greater than one-half the supply voltage level and less than the reliability limit, and the final pbias voltage is greater than a difference between the supply voltage level and the reliability limit and less than one-half the supply voltage level. In response to the supply voltage level being less than the reliability limit, the final pbias voltage is pulled to ground level, and the final nbias voltage is pulled to the supply voltage level. The voltage level of the sense signal is less than the supply voltage level. A receiver is controllable to operate in a first voltage mode that is greater than the reliability limit or operate in a second voltage mode that is less than the reliability limit. The receiver is coupled to receive the final pbias voltage and the final nbias voltage. A power-on-reset circuit is coupled to receive the sense signal from the biasing circuit and is configured to force output from the receiver to a constant logic value during ramp-up of the supply voltage.

Another disclosed circuit arrangement includes a biasing circuit that is configured to generate a pbias voltage and an nbias voltage in response to a supply voltage level. In response to the supply voltage level being greater than the reliability limit of transistors of the biasing circuit, the pbias voltage is greater than a difference between the supply voltage level and the reliability limit and less than one-half the supply voltage level, and the nbias voltage is greater than one-half the supply voltage level and less than the reliability limit. In response to the supply voltage level being less than the reliability limit, the pbias voltage is greater than ground level and less than twice a gate-source threshold of a first p-type transistor providing the pbias voltage, and the nbias voltage is greater than twice a gate-source threshold of a first n-type transistor providing the nbias voltage and less than the supply voltage level. A transmitter is controllable to operate in a first voltage mode that is greater than the reliability limit or a second voltage mode that is less than the reliability limit. A driver of the transmitter is coupled to receive the pbias voltage and the nbias voltage.

A disclosed circuit arrangement includes a first biasing circuit configured to generate a final pbias voltage, a final nbias voltage, and a sense signal in response to a supply voltage level. In response to the supply voltage level being greater than the reliability limit of transistors of the first biasing circuit, the final nbias voltage is greater than one-half the supply voltage level and less than the reliability limit, and the final pbias voltage is greater than a difference between the supply voltage level and the reliability limit and less than one-half the supply voltage level. In response to the supply voltage level being less than the reliability limit, the final pbias voltage is pulled to ground level, and the final nbias voltage is pulled to the supply voltage level. The voltage level of the sense signal is less than the supply voltage level. A receiver is controllable to operate in a first voltage mode that is greater than the reliability limit or operate in a second voltage mode that is less than the reliability limit. The receiver is coupled to receive the final pbias voltage and the final nbias voltage. A power-on-reset circuit is coupled to receive the sense signal from the biasing circuit and is configured to force output from the receiver to a constant logic value during ramp-up of the supply voltage. A second biasing circuit is configured to generate a transmit-pbias voltage and a transmit-nbias voltage in response to a supply voltage level. In response to the supply voltage level being greater than the reliability limit, the transmit-pbias voltage is greater than a difference between the supply voltage level and the reliability limit and less than one-half the supply voltage level, and the transmit-nbias voltage is greater than one-half the supply voltage level and less than the reliability limit. In response to the supply voltage level being less than the reliability limit, the transmit-pbias voltage is greater than ground level and less than twice a gate-source threshold of a first p-type transistor providing the pbias voltage, and the transmit-nbias voltage is greater than twice a gate-source threshold of a first n-type transistor providing the nbias voltage and less than the supply voltage level. A transmitter is controllable to operate in the first voltage mode or the second voltage mode. A driver of the transmitter is coupled to receive the transmit-pbias voltage and the transmit-nbias voltage.

Other features will be recognized from consideration of the Detailed Description and Claims, which follow.

BRIEF DESCRIPTION OF THE DRAWINGS

Various aspects and features of the biasing circuitry will become apparent upon review of the following detailed description and upon reference to the drawings in which.

DETAILED DESCRIPTION

Figure 1:
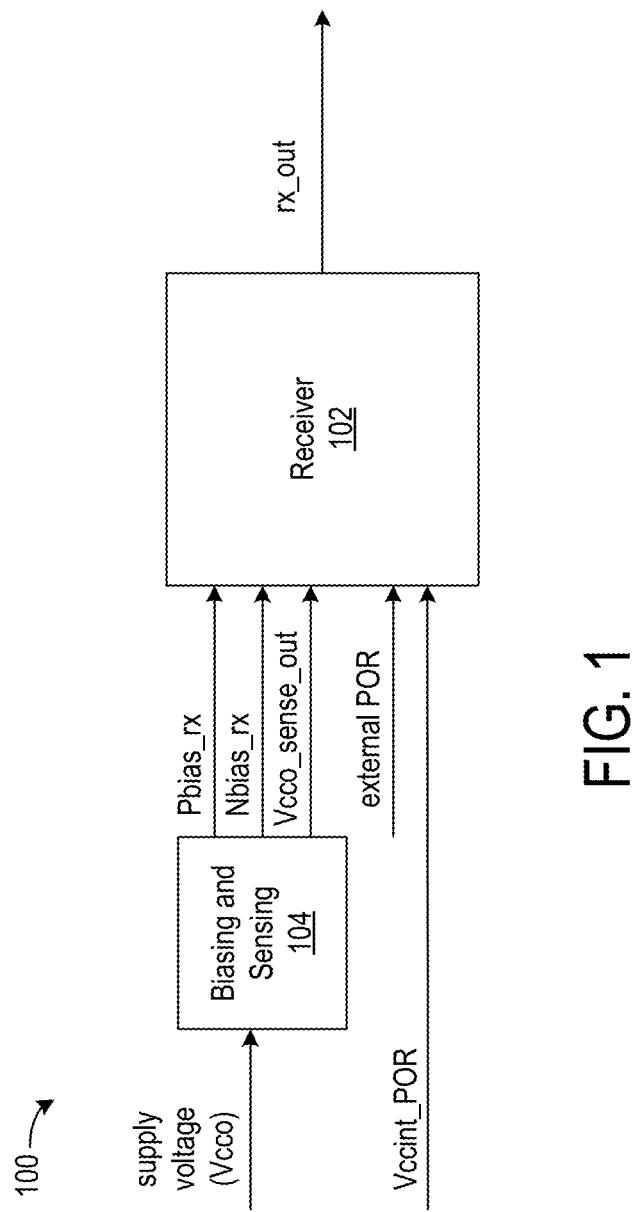
FIG. 1 shows an exemplary circuit arrangement in which a supply voltage level is detected and used to generate suitable biasing for a wide supply range integrated circuit (IC) receiver.

In the following description, numerous specific details are set forth to describe specific examples presented herein. It should be apparent to one skilled in the, however, art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Complex systems may have multiple integrated circuit (IC) die disposed on a circuit board and intercommunicating and operating in different voltage domains. Reliable supply voltage levels are critical for inter-die communication. In some implementations of transceivers on the IC dice, a pulse of a Power-On Reset (POR) signal triggers setting a transceiver to an initial state after the supply voltage is detected. During a power-up sequence, outputs of the transceiver should be maintained at a low logic level in order to ensure reliable signaling between transceivers. However, errors may occur if the initialization is triggered before the supply voltage has risen to a suitable level. Until the supply voltage has risen to the desired level, the transceiver cannot accurately detect whether an input voltage is low voltage (1.2V-1.8V) or high voltage (2.5V & 3.3V). An errant detection of the POR signal can lead system failure.

The disclosed circuitry detects the supply voltage level to the "device" (SoC, chip, SiP, etc.) and adjusts bias voltages to receiver and transmitter circuits of the device to levels suitable for the device in response to the supply voltage ramping-up during a power-on reset sequence. The circuitry holds the receiver output at a constant logic value (e.g., logic 0) while the supply voltage is ramping up and the POR signal is asserted. The disclosed circuitry also protects the transceiver as the voltage domain of the input signal is unknown and the voltage between any two terminals of a transistor of the transceiver cannot exceed a critical level (e.g., ~1.98V).

FIG. 1 shows an exemplary circuit arrangement 100 for detecting a supply voltage level and generating suitable biasing for a wide range supply voltage integrated circuit (IC) receiver. The exemplary receiver 102 can be controlled to operate (or switched between operating) in either a high-voltage ("HV") or a low voltage ("LV") mode. For example, an HV mode can be defined as the supply voltage level being greater than 1.8V (e.g., 2.5V & 3.3V), and an LV mode can be defined as the supply voltage level being less than <1.8V (e.g., 1.2V, 1.5V & 1.8V modes). In the following examples, 1.8V is the reliability limit across terminals of the transistors disclosed circuitry (both for the receiver and transmitter). The reliability limit is the maximum voltage across any two terminals of a transistor that cannot be exceeded without risking unexpected operation. The reliability limit can vary between different IC technologies. The disclosed circuitry can be tuned for different reliability limits across technology nodes.

The biasing and sensing circuit 104 senses the level of the supply voltage (Vcco) and enables the receiver to reliably receive and respond to a power-on-reset ("POR") signal (Vccint_POR) and an external POR signal (asserted by a user in vcco domain) for a range of 1.2V to 3.3V. "Vcco" is the supply voltage to input/output logic of the device. The generated bias voltages also protect elements of the receiver while operating in a high voltage mode.

The biasing circuit 104 generates Pbias_rx and Nbias_rx voltages at levels that maintain circuit reliability in response to the level of the supply voltage, which is indicative of HV and LV operating conditions. A supply voltage level greater than the reliability limit is indicative of HV mode, and a supply voltage level less than the reliability limit is indicative of LV mode. In HV mode, the voltage level of Nbias_rx is set greater than a proper fraction of the level of the supply voltage (e.g., ½*Vcco) and less than the reliability limit (e.g., 1.8V). Also in HV mode, the Pbias_rx voltage is set to a voltage level greater than a difference between the supply voltage level and the reliability limit and less than one-half the supply voltage level. In LV mode, the Pbias_rx voltage is pulled to ground level, and the Nbias_rx voltage is pulled to the supply voltage level.

Figure 2:
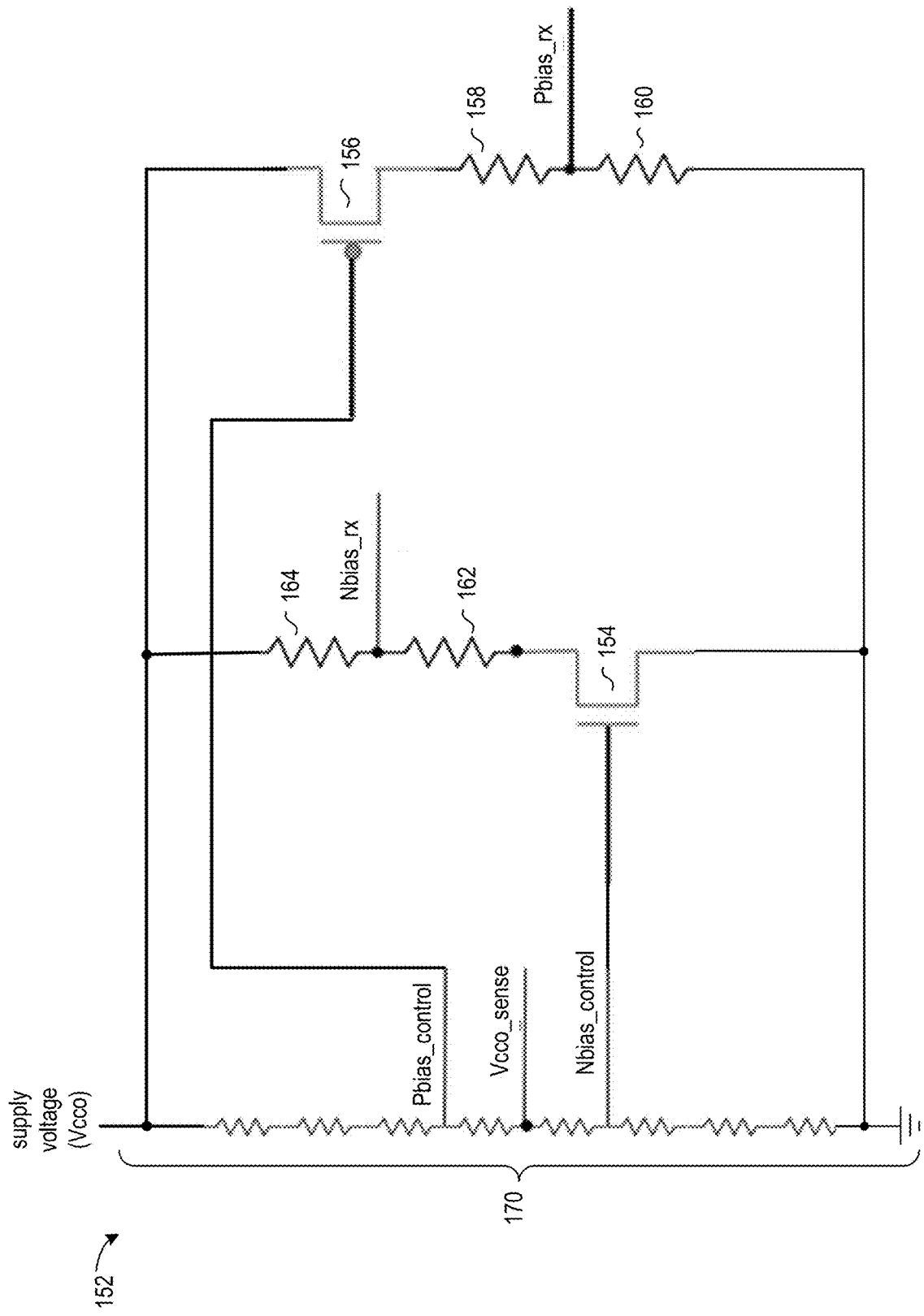
FIG. 2 shows the biasing generation portion of the biasing and sensing circuit of FIG. 1.

FIG. 2 shows the biasing generation portion 152 of the biasing and sensing circuit 104 of FIG. 1. In a first stage, a resistor-divider circuit 170 generates three voltage levels. The voltages are generated based on ratio of resistor-division. According to an exemplary implementation, Pbias_control, Nbias_control and Vcco_sense voltages are generated at 70%, 30% and 65% of the supply voltage (Vcco). The sizes and numbers of resistors in the first stage can be selected to provide Pbias_control, N_bias control, and Vcco_sense for desired levels of performance and compatibility.

The Pbias_control and Nbias_control voltages are used as inputs to a second stage of bias generation and used to generate the Nbias_rx and Pbias_rx voltages, which are input to the receiver 102. The Nbias_control and Pbias_control voltages in the second stage are coupled to the gates of n-type transistor 154 and p-type transistor 156, respectively. The source of n-type transistor 154 is coupled to ground, and the drain is coupled through resistors 162 and 164 to the supply voltage. The Nbias_rx voltage is provided from a node connected between resistors 162 and 164. The source of p-type transistor 156 is coupled to the supply voltage Vcco, and the drain is coupled through resistor 158 to a node that provides the Pbias_rx voltage. The node that provides the Pbias_rx voltage is coupled through resistor 160 to ground.

Table 1 shows exemplary voltage levels in HV mode and LV mode of the signals in the biasing generation portion of the biasing and sensing circuit. Note that "Vstress" in Table 1 is the reliability limit, which in the exemplary implementation is 1.8V.

TABLE 1

| Bias Voltages | | |
|---|---|---|
| Signals | HV mode | LV mode |
| Pbias_control | 0.7*Vcco | 0.7*Vcco |
| Nbias_control | 0.3*Vcco | 0.3*Vcco |
| VCCO_SENSE | 0.65*Vcco | 0.65*Vcco |
| Nbias_rx | >Vcco/2 & <Vstress | ~Vcco |
| Pbias_rx | >(Vcco – Vstress) & <Vcco/2 | ~0 |

Figure 3:
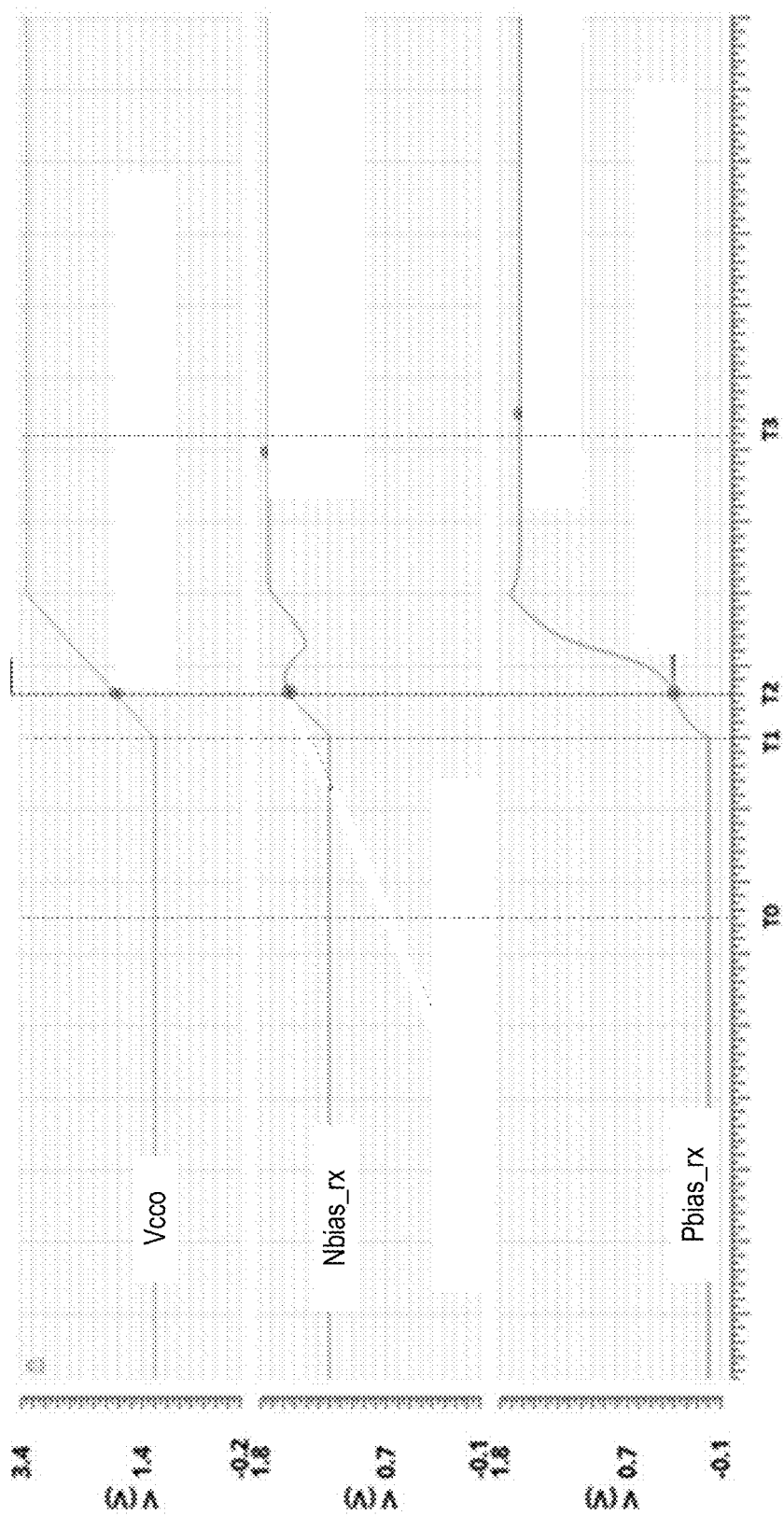
FIG. 3 shows an exemplary timing diagram of generating the biasing voltages by the biasing and sensing circuit of FIG. 1.

FIG. 3 shows an exemplary timing diagram of generating the biasing voltages by the biasing and sensing circuit of FIG. 1. The example assumes switching the supply voltage level from 1.2V to 3.3V and the voltage levels generated from the first stage as shown in Table 1.

At time T0, Vcco=~1.2V, Nbias_control and Pbias_control are 0.36V and 0.84V, respectively (not shown), and the gate-to-source voltages (Vgs's) of transistors 154 and 156=~0.36V. The Vgs's of both transistors are less than the respective gate-source threshold voltages (Vtn and Vtp=~0.5V) of the transistors, and both transistors are switched off. When both transistors are switched off, Nbias_rx is pulled to Vcco and Pbias_rx is pulled to ground.

At time T1, Vcco begins ramping from 1.2V to 3.3V (LV to HV), and Nbias_control and Pbias_control voltages begin rising, causing transistors 154 and 156 to begin weakly switching on and Nbias_rx and Pbias_rx voltage levels to begin rising At time T2, when the level of Vcco becomes greater than the threshold reliability limit 1.8V, transistors 154 and 156 are weakly switched on, thereby causing Nbias_rx and Pbias_rx to rise to approximately Vcco/2. The transition provides reliability of the circuit in HV modes of operation. The sizes of transistors 154 and 156 can be large enough to provide minimum contribution in the generation of Nbias_rx and Pbias_rx voltages. That is, the ratio of the resistance between the resistors 162 and 164 and transistor 154 is very high, as is the ratio of the resistance between the resistors 158 and 160 and transistor 156.

At time T3, Vcco=~3.3V, resulting in Nbias_control=1V and Pbias_control=~2.3V. With Nbias_control=~1V, transistor 154 transistor is strongly switched on (Vgs=~1V). With Pbias_control=~2.3V, transistor 156 is also strongly switched on (Vgs=~1V). With both transistors 156 and 156 strongly switched on, Nbias_rx and Pbias_rx are near Vcco/2 and within the limits of Vcco/2<Nbias_rx<Vstress, and (Vcco–Vstress)<Pbias_rx<Vcco/2.

Figure 4:
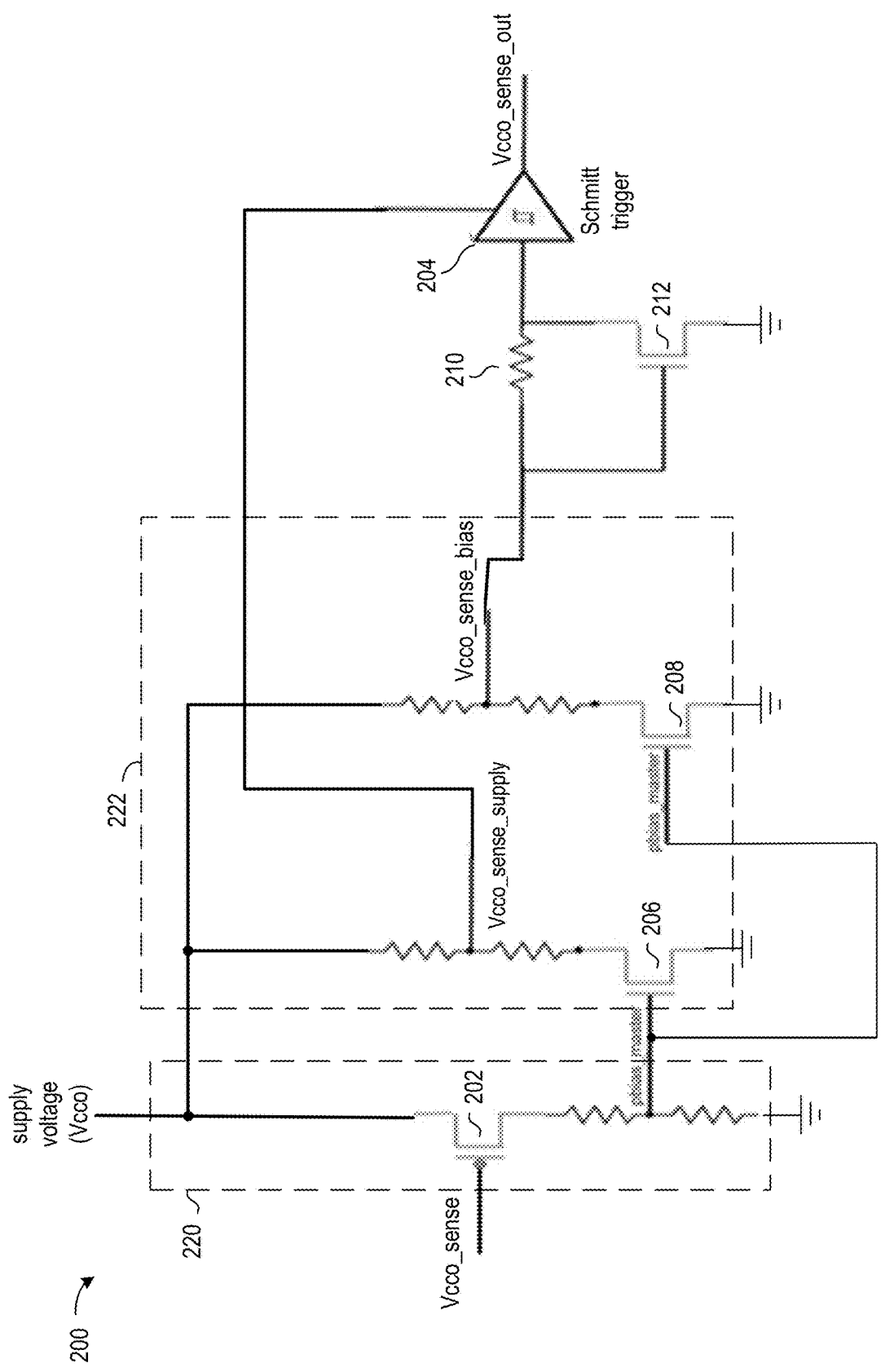
FIG. 4 shows the sensing portion of the biasing and sensing circuit of FIG. 1.

FIG. 4 shows the sensing portion 200 of the biasing and sensing circuit of FIG. 1. The sensing portion (or "sensing circuit") is configured to generate a Vcco_sense_out voltage that is used in controlling when the receiver can generate an output in response to the availability of supply voltages The sensing circuit is divided into 3 stages. In the first stage 220, the input Vcco_sense voltage, which is generated from the bias generation circuit of FIG. 2, is used to generate a pbias_master voltage. In an exemplary implementation, in both HV mode and LV mode Vcco_sense=0.65*Vcco, and transistor 202 is switched on. In LV mode at 1.2V, pbias_master=~0V, and at 1.8V pbias_master=~Vcco/2. In HV mode, (Vcco–Vstress)<pbias_master<Vcco/2.

In the second stage 222, the pbias_master voltage controls generation of Vcco_sense_bias and Vcco_sense_supply voltages. The circuit topologies for generating the Vcco_sense_bias and Vcco_sense_supply voltages are similar replicas but element sizes can vary to according to desired switching voltages. The ratio of sizes of transistors 206 and 208 and the associated resistors can be such that Vcco_sense_supply>Vcco_sense_bias for an optimum switching point of the Schmitt trigger 204.

The Vcco_sense_bias and Vcco_sense_supply voltages are applied to the low-voltage Schmitt trigger circuit 204. In response to the pbias_master voltage switching on transistors 206 and 208, the voltage levels of Vcco_sense_supply and Vcco_sense_bias are pulled to the voltage levels for HV and LV modes as shown in Table 2.

TABLE 2

| Sense Voltages | | | |
|---|---|---|---|
| Sense Voltages | 3.3 V(HV) | 1.8 V(LV) | 1.2 V(LV) |
| Vcco_sense | 0.65*Vcco | 0.65*Vcco | 0.65*Vcco |
| pbias_master | >(Vcco – Vstress) & <Vcco/2 | ~0.5*Vcco | ~0 |
| Vcco_sense_bias | >Vcco/2 & <Vstress | ~0.5*Vcco | ~Vcco |
| Vcco_sense_supply | >Vcco/2 & <Vstress | ~0.5*Vcco | ~Vcco |
| Vcco_sense_out | ~0.5*Vcco | ~0.5*Vcco | ~Vcco |

In the third stage 204, the Schmitt trigger circuit generates the switching point during ramp-up of the supply voltage. The switching point decides the desired level of Vcco at which the supply voltage is suitable for enabling the receiver. The Vcco_sense_supply voltage is coupled to one input of the Schmitt trigger circuit, and the Vcco_sense_bias voltage is coupled through resistor 210 to the second input of the Schmitt trigger circuit. The Vcco_sense_bias voltage is also coupled to the gate of n-type transistor 212, which has a source coupled to ground and a drain coupled to the second input of the Schmitt trigger circuit.

Figure 5:
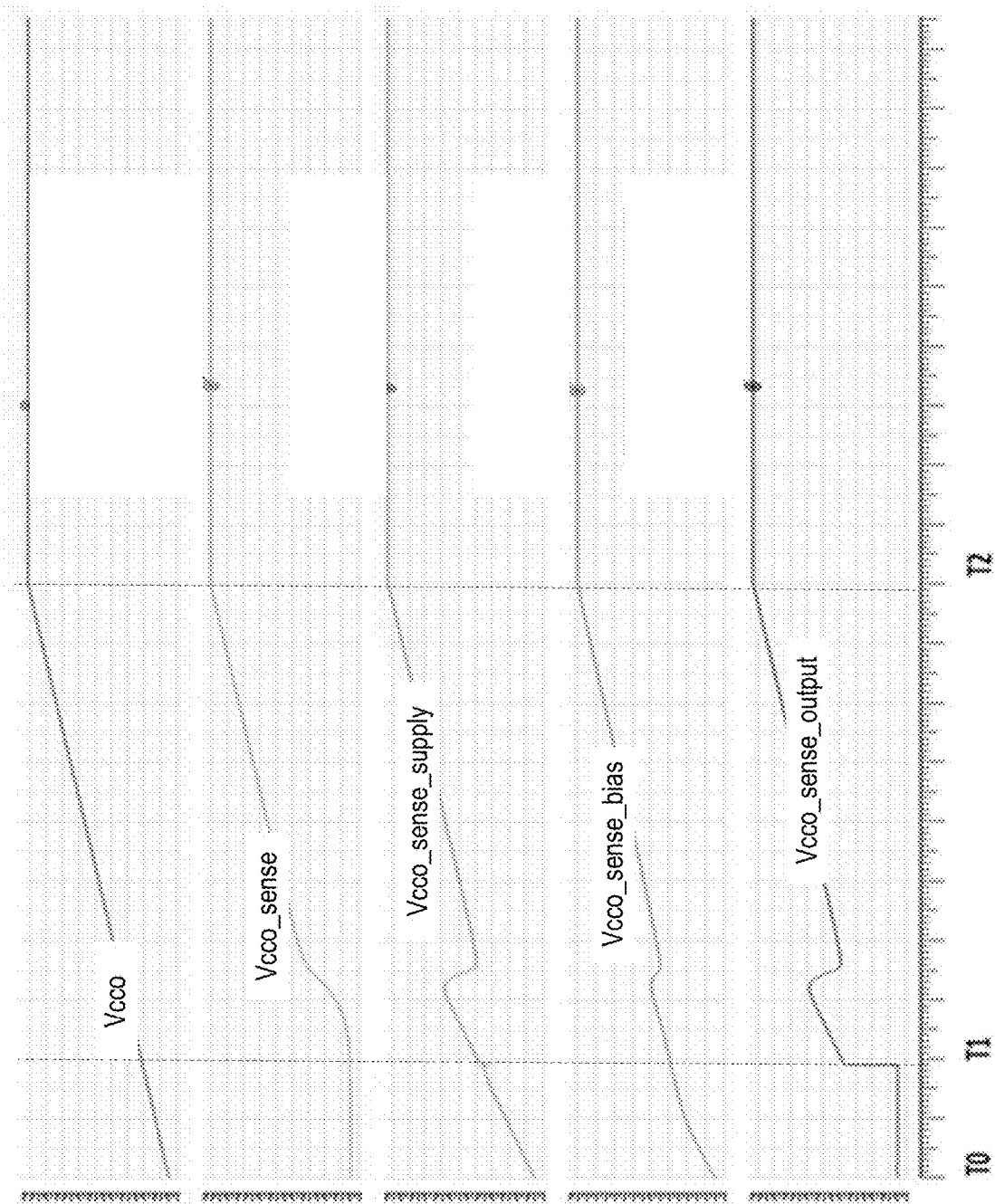
FIG. 5 shows a timing diagram of generating the Vcco_sense_out voltage by the sensing circuit of FIG. 4 for input to the power-on-reset protection circuit of the receiver.

FIG. 5 shows a timing diagram of generating the Vcco_sense_out voltage by the sensing circuit of FIG. 4 for input to the power-on-reset protection circuit of the receiver. At time T=0, supply voltage Vcco begins ramping up. At voltage levels of Vgs<Vtp of p-type transistor 202, the transistor is switched off, and pbias_master is pulled to ground, which switches off n-type transistors 206 and 208. When transistors 206 and 208 are switched off, vcco_sense_supply and vcco_sense_bias voltages follow the voltage level of Vcco. When the voltage level of Vcco is less than the Vtp of transistor 202 and Vtn of transistors 206 and 208, the Schmitt trigger circuit 204 does not switch, and Vcco_sense_out remains pulled to ground.

At T1, as Vcco continues to ramp up with Vcco_sense_supply and Vcco_sense_bias following, Vcco reaches the voltage level at which the Schmitt trigger circuit 204 starts to turn on, resulting in the switching point. The switching point is the voltage level at which the Vcco is recognized HIGH by the sensing circuit. The switching points of Vcco_sense_out are in the range of 0.6V-1.0V according to an exemplary technology. The voltage levels can be varied for different reliability limits of different technology nodes.

At time T2, the Vcco_sense input voltage reaches the desired level, as exemplified Table 2, and thereby modulates transistor 202 in providing the voltage level of pbias_master. Once pbias_master reaches a voltage level that switches on transistors 206 and 208, Vcco_sense_supply and Vcco_sense_bias are pulled to the desired voltage level. Controlling the voltage level of pbias_master helps to limit the voltage levels of Vcco_sense_supply and Vcco_sense_bias when Vcoo is below the reliability limit of the transistor (e.g., 1.8V).

Figure 6:
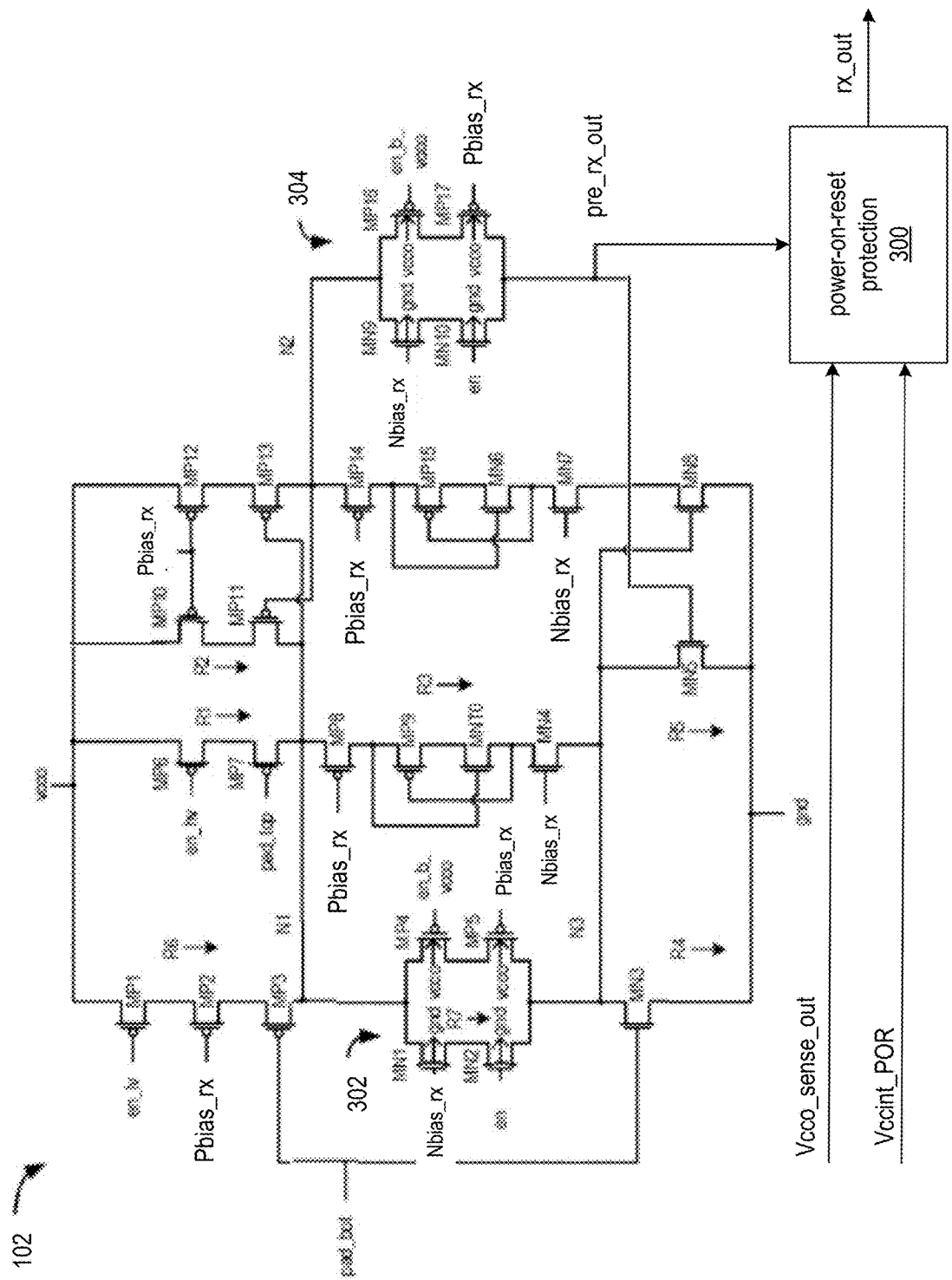
FIG. 6 shows a schematic diagram depicting an example of the wide-range receiver, the output of which is disabled and enabled by the power-on-reset protection circuit.

FIG. 6 is a schematic diagram depicting an example of the wide-range receiver 102, the output of which is disabled and enabled by the power-on-reset protection circuit 300. The POR protection circuit 300 is coupled to input the output signal pre_rx_out from the receiver circuitry, and in response to the voltage levels of the Vcco_sense_out (from the sensing circuit, FIG. 4) and the Vccint_POR (FIG. 1) signals either forces the rx_out signal to a constant logic value (e.g., logic 0 disables output from the receiver) or passes the logic level of the pre_rx_out signal as receiver output.

The wide-range receiver includes p-channel transistors MP1 through MP17, an n-channel transistor MNT0, and n-channel transistors MN1 through MN10. A source of the transistor MP1 is coupled to the supply node vcco. A drain of the transistor MP1 is coupled to a source of the transistor MP2. A drain of the transistor MP2 is coupled to a source of the transistor MP3. A drain of the transistor MP3 is coupled to a node N1. A gate of the transistor MP1 receives a control voltage en_lv. A gate of the transistor MP2 receives bias voltage Pbias_rx. A gate of the transistor MP3 is coupled to a node pad_bot.

A source of the transistor MP6 is coupled to the supply node Vcco. A drain of the transistor MP6 is coupled to a source of the transistor MP7. A drain of the transistor MP7 is coupled to the node N1. A gate of the transistor MP6 receives a control voltage en_hv. A gate of the transistor MP7 is coupled to a node pad_top.

A source of the transistor MP10 is coupled to the supply node Vcco. A drain of the transistor MP10 is coupled to a source of the transistor MP11. A drain of the transistor MP11 is coupled to the node N1. A source of the transistor MP12 is coupled to the supply node Vcco. A drain of the transistor MP12 is coupled to a source of the transistor MP13. A drain of the transistor MP13 is coupled to a node N2. A gate of the transistor MP10 is coupled to a gate of the transistor MP12, each of which is also coupled to the node supplying the bias voltage Pbias_rx. A gate of the transistor MP13 is coupled to the node N1. A gate of the transistor MP11 is coupled to the node N2.

Substrate terminals of the transistors MN1 and MN2 are coupled to the ground node gnd. Substrate terminals of the transistors MP4 and MP5 are coupled to the supply node Vcco. One source/drain of the transistor MN1 is coupled to the node N1, and the other source/drain of the transistor MN1 is coupled to a source/drain of the transistor MN2. The other source/drain of the transistor MN2 is coupled to a node N3. Likewise, one source/drain of the transistor MP4 is coupled to the node N1, and the other source/drain of the transistor MP4 is coupled to a source/drain of the transistor MP5. The other source/drain of the transistor MP5 is coupled to the node N3. A gate of the transistor MN1 is coupled to receive the bias voltage Nbias_rx. A gate of the transistor MN2 is coupled to receive a control voltage en. A gate of the transistor MP5 is coupled to receive the bias voltage Pbias_rx. A gate of the transistor MP4 is coupled to receive a control voltage en_b_vcco. The transistors MN1, MN2, MP4, and MP5 form a transmission gate 302.

A source of the transistor MP8 is coupled to the node N1. A drain of the transistor MP8 is coupled to a source of the transistor MP9. A drain of the transistor MP9 is coupled to a drain of the transistor MNT0. A source of the transistor MNT0 is coupled to a drain of the transistor MN4. A source of the transistor MN4 is coupled to the node N3. A gate of the transistor MP8 is coupled to the bias voltage Pbias_rx. A gate of the transistor MN4 is coupled to the bias voltage Nbias_rx. A gate of the transistor MNT0 is coupled to the drain of the transistor MP8. A gate of the transistor MP9 is coupled to the drain of the transistor MN4.

A source of the transistor MP14 is coupled to the node N2. A drain of the transistor MP14 is coupled to a source of the transistor MP15. A drain of the transistor MP15 is coupled to a drain of the transistor MN6. A source of the transistor MN6 is coupled to a drain of the transistor MN7. A source of the transistor MN7 is coupled to the pre_rx_out node. A gate of the transistor MP14 is coupled to the bias voltage Pias_rx. A gate of the transistor MN7 is coupled to the bias voltage Nbias_rx. A gate of the transistor MN6 is coupled to the drain of the transistor MP14. A gate of the transistor MP15 is coupled to the drain of the transistor MN7.

Substrate terminals of the transistors MN9 and MN10 are coupled to the ground node gnd. Substrate terminals of the transistors MP16 and MP17 are coupled to the supply node Vcco. One source/drain of the transistor MN9 is coupled to the node N2, and the other source/drain of the transistor MN9 is coupled to a source/drain of the transistor MN10. The other source/drain of the transistor MN10 is coupled to the pre_rx_out node. Likewise, one source/drain of the transistor MP16 is coupled to the node N2, and the other source/drain of the transistor MP16 is coupled to a source/drain of the transistor MP17. The other source/drain of the transistor MP17 is coupled to the pre_rx_out node. A gate of the transistor MN9 is coupled to receive the bias voltage Nbias_rx. A gate of the transistor MN10 is coupled to receive a control voltage en. A gate of the transistor MP17 is coupled to receive the bias voltage Pbias_rx. A gate of the transistor MP16 is coupled to receive a control voltage en_b_vcco. The transistors MN9, MN10, MP16, and MP17 form a transmission gate 304.

A drain of the transistor MN3 is coupled to the node N3. A source of the transistor MN3 is coupled to the node gnd. A gate of the transistor MN3 is coupled to the node pad_bot. A drain of the transistor MN5 is coupled to the node N3. A source of the transistor MN5 is coupled to the node gnd. A drain of the transistor MN8 is coupled to the pre_rx_out node. A source of the transistor MN8 is coupled to the node gnd. A gate of the transistor MN8 is coupled to the node N3. A gate of the transistor MN5 is coupled to the pre_rx_out node.

Figure 7:
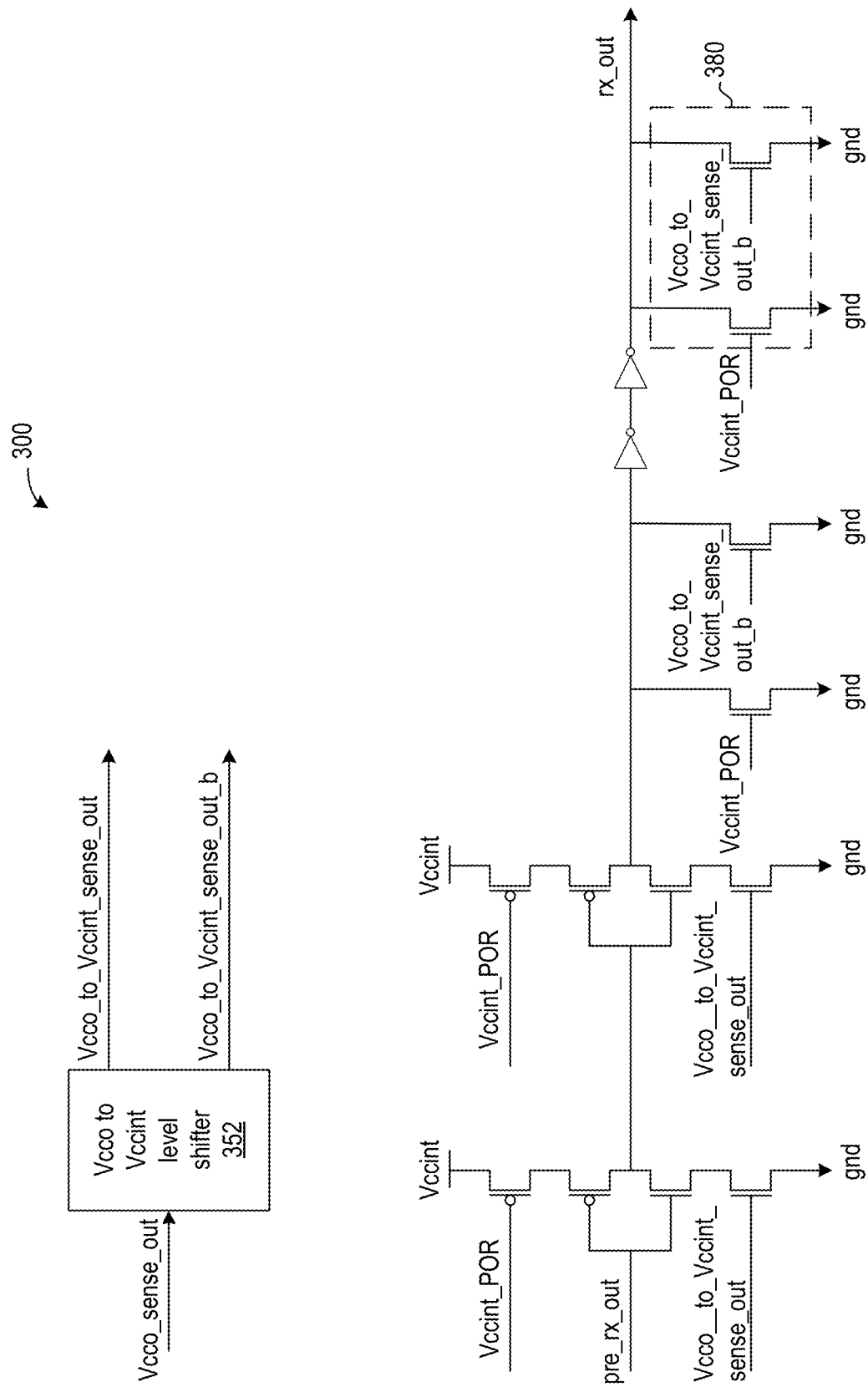
FIG. 7 shows a schematic of the power-on-reset protection circuit of FIG. 6.

FIG. 7 shows a schematic of the power-on-reset protection circuit 300 of FIG. 6. The POR protection circuit disables output from the receiver during ramp-up of the Vcco and Vccint supply voltages while the Vcco supply voltage is less than a threshold minimum operational voltage or while the POR signal is asserted.

The level shifter 352 generates the Vcco_to_Vccint_sense_out and Vcco_to_Vccint_sense_out_b voltages in response to the Vcco_sense_out signal, which is generated by the sensing circuit of FIG. 4. When Vcco_sense_out is logic 1, Vcco_to_Vccint_sense_out is logic 1, and Vcco_to_Vccint_sense_out_b is logic 0. When Vcco_sense_out is logic 0, Vcco_to_Vccint_sense_out is logic 0, and Vcco_to_Vccint_sense_out_b is logic 1.

Vccint is the internal supply voltage of the device having the receiver (Vcco to the receiver is the supply voltage to the IO circuitry), and Vccint_POR is provided from POR logic of the device. When Vccint is logic 1, Vccint_POR is logic 0, and when Vccint is logic 0, Vccint_por is logic 1. Generally, if VccintPOR is asserted or either Vccint or Vcco is not on or ramped up, rx_output is pulled to low by pulldown circuit 380.

The pre_rx_out signal generated by the biased receiver circuitry (FIG. 6) is provided as input to the power-on-reset circuit.

Figure 8:
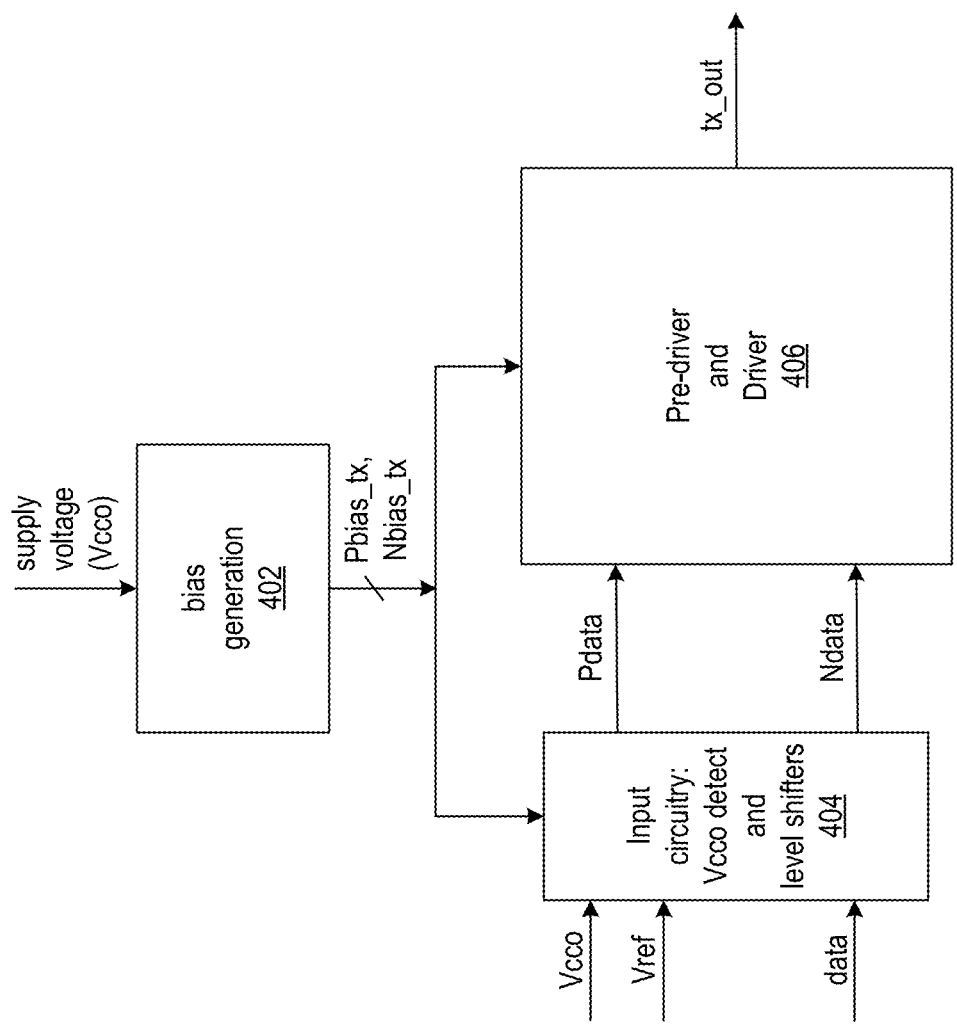
FIG. 8 shows an exemplary circuit arrangement in which a supply voltage level is detected and used to generate suitable biasing for a wide-range supply IC transmitter.

FIG. 8 shows an exemplary circuit arrangement in which a supply voltage level is detected and used to generate suitable biasing for a wide-range supply IC transmitter. The bias generation circuit 402 generates Pbias_tx and Nbias_tx voltages in response to the level of the supply voltage Vcco, and provides the bias voltages to the input circuitry 404 and the pre-driver and driver circuitry 406.

The input circuitry 404 inputs the supply voltage Vcco and a reference voltage Vref for detecting the desired voltage level. An input of the input circuitry is coupled to receive an input logic signal. The input logic signal is a digital data signal that has either a logic high or a logic low value. The input circuitry includes detect circuits and level shifters to shift the voltage level of the input data signal accordingly and provide Pdata and Ndata signals as inputs to the pre-driver and driver circuitry 406.

The bias voltages Pbias_tx and Nbias_tx from bias generation circuit 402 are suitable for POR control, HV and LV modes of the transmitter, controlled duty cycle distortion (DCD), and process-voltage-temperature (PVT) compensation.

The pre-driver and driver circuitry 406 generate the tx_out signal in response to the Pdata and Ndata signals and bias voltages Pbias_tx and Nbias_tx.

Figure 9:
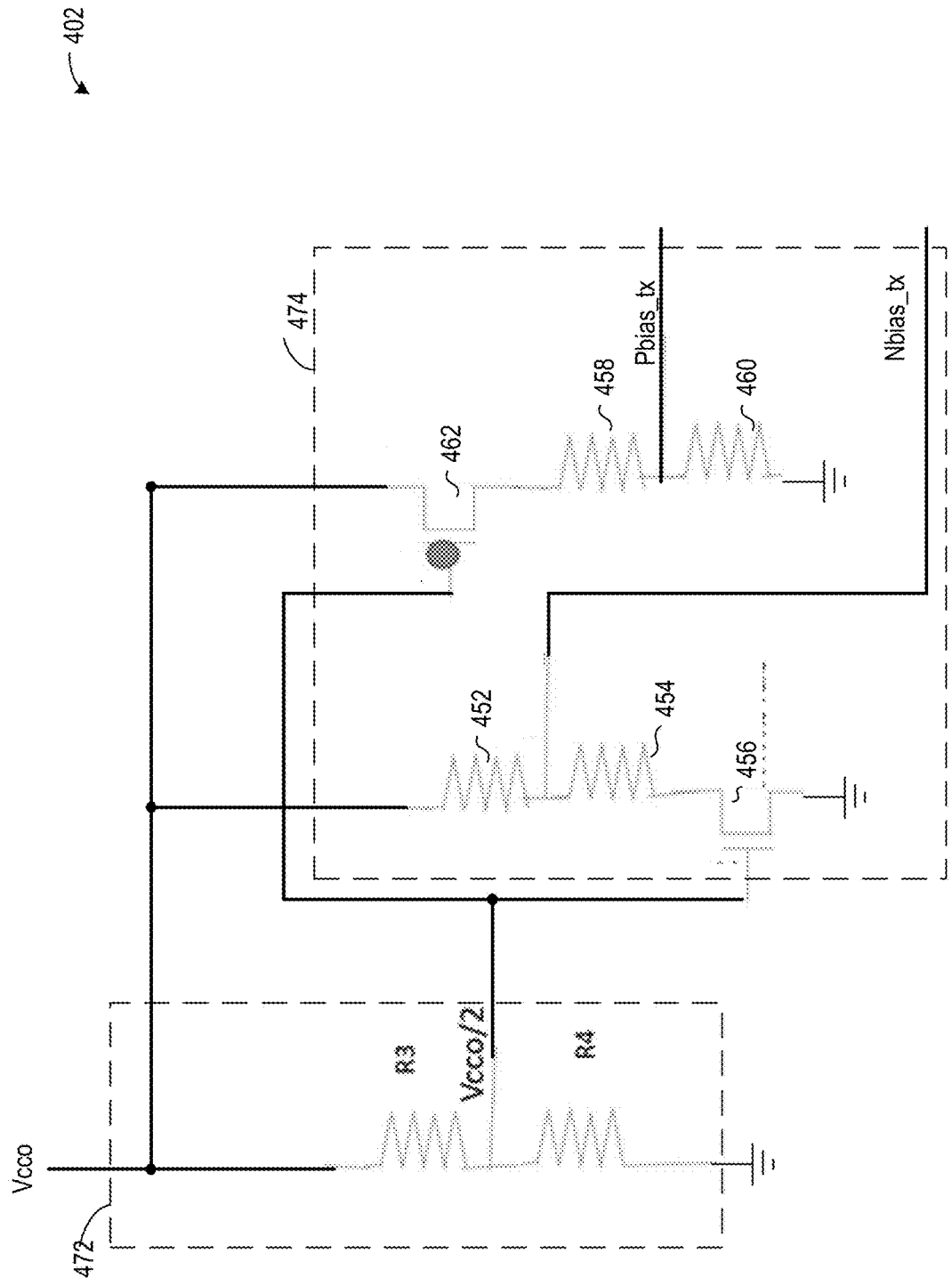
FIG. 9 shows a circuit diagram of the bias generation circuit of FIG. 8.

FIG. 9 shows a circuit diagram of the bias generation circuit 402 of FIG. 8. The bias generation circuit generates the Pbias_tx and Nbias_tx voltages, which are input to the pre-driver and driver circuitry to control the drive strength and DCD of the tx_out signal. A first stage 472 provides a control signal that has a voltage level that is a proper fraction of the supply voltage level (e.g., Vcco/2). A second stage 474 generates the Nbias_tx and Pbias_tx voltages. The Nbias_tx voltage is provided from a node connected between resistors 452 and 454 is generated using R5,R6 and NMOS Mnbias. The voltage level of Nbias_tx=Vcco*(resistance454+ONresistance456)/(resistance452+resistance454+ONresistance456); "resistance454" is the resistance of resistor 454; "ONresistance456 is the resistance of transistor 456 when switched on, and "resistance452" is the resistance of resistor 452. With a suitable ratio between resistors 452 and 454 and transistor 456, Nbias_tx will be inversely proportional to Vcco and process variations and directly proportional to temperature variations. When the voltage level of Vcco value is high, transistor 456 will have more overdrive and its ONresistance will be less, which pulls Nbias_tx to a lower level. Similarly, when Nmos is in fast process corner, the resistance of transistor 456 Mnbias when switched on will be less, resulting in a reduction of the Nbias_tx level as compared to a slow process corner. An increase in temperature will cause a decrease in the threshold voltage of transistor 456, and the switched-on resistance will decrease and will pull the level of Nbias_tx higher.

The Pbias_tx voltage is generated using resistors 458 and 460 and p-type transistor 462. The voltage level of Pbias_tx=Vcco*resistance460/(resistance458+resistance460+ONresistance462); "resistance458" is the resistance of resistor 458, "resistance460" is the resistance of resistor 460, and "ONresistance462" is the resistance of transistor 462 when switched on. The voltage level of Pbias_tx will be directly proportional to Vcco and process variations and inversely proportional to temperature variations with a suitable ratio of resistance458, resistance460, and ONresistance462. When the voltage level of Vcco is high, transistor 462 will have more Overdrive and its ON-resistance will be less, and the voltage level of Pbias_tx will be pulled to a greater value. Similarly, when Pmos is in a fast process corner, the ON-resistance of transistor 462 will be less, increasing the voltage level of Pbias_tx as compared to a slow process corner. An increase in temperature will cause the threshold voltage of transistor 462 to decrease, and the ON-resistance of transistor 462 will decrease, pulling the voltage level of Pbias_tx lower.

Table 3 shows voltage levels of Nbias_tx and Pbias_tx in HV and LV modes.

TABLE 3

| Bias Voltages | TX Bias Voltages | |
|---|---|---|
| | HV | LV |
| Nbias_tx | >Vcco/2 & <Vstress | >2Vtn of transistor 462 & <Vcco |
| Pbias_tx | >(Vcco − Vstress) & <Vcco/2 | >0 & <2Vtp of transistor 462 |

Table 4 shows relative voltage levels of Nbias_tx and Pbias_tx for PVT corners.

TABLE 4

| TX Bias voltage relative to PVT | | |
|---|---|---|
| Condition | Nbias_tx | Pbias_tx |
| Process Fast/Slow | Low/High | High/Low |
| Voltage Max/Min | Low/High | High/Low |
| Temperature Max/Min | High/Low | Low/High |

The generated Nbias_tx and Pbias_tx voltage levels aids in making the driver strong in slow PVT corners and weak in fast PVT corners, which reduces variations in the drive strength over PVT variations, reduces DCD variations, and improves the electromagnetic interference (EMI) rejection ratio (EMIR), electro migration, and IR drop, which reduces overshoots and undershoots and makes design of the printed circuit board easier.

Figure 10:
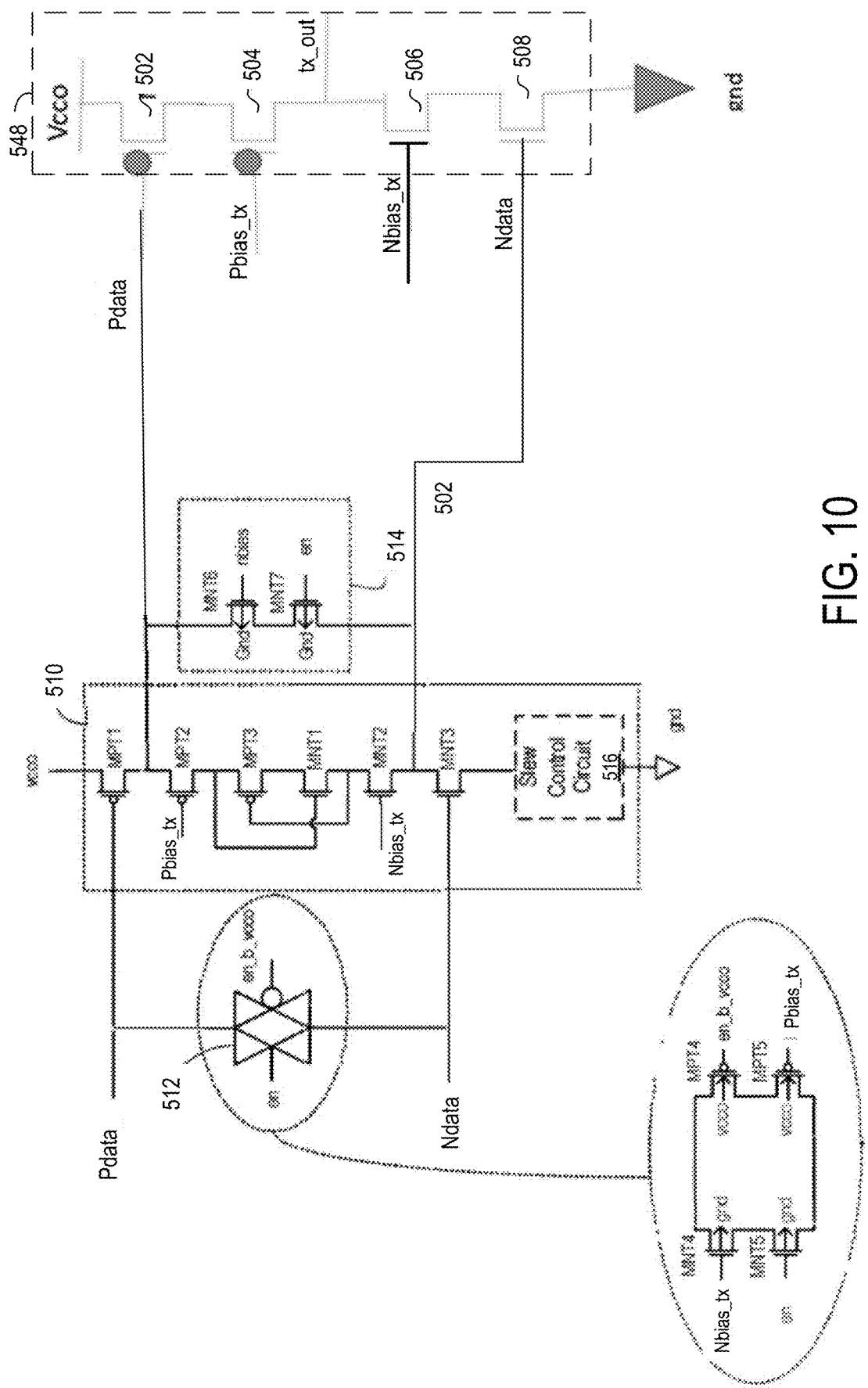
FIG. 10 shows exemplary pre-driver and driver circuitry of the circuit arrangement of FIG. 8.

FIG. 10 shows exemplary pre-driver and driver circuitry of the circuit arrangement of FIG. 8. The driver 548 includes transistors 502, 504, 506, and 508. The gates of transistors 504 and 506 are coupled to the Pbias_tx and Nbias_tx voltages, respectively, and the gates of transistors 502 and 508 are coupled to Pdata and Ndata voltages from the pre-driver, respectively. The Pbias_tx and Nbias_tx voltages help in controlling the drive strength and DCD.

In slow process corners for NMOS devices, the Nbias_tx voltage will be pulled higher and thereby increase the drive strength of the transistor 506. Similarly, when in fast process corners, the Nbias_tx voltage is pulled lower and the drive strength of transistor 506 is reduced. In slow process corners for PMOS devices, the Pbias_tx voltage is pulled lower and the drive strength of transistor 504 is increased. In fast process corners for PMOS devices, the Pbias_tx voltage will be pulled higher and the drive strength of transistor 504 will be reduced.

The pre-driver includes a transistor stack 510, a transmission gate 512, and a transmission gate 514. The transistor stack 510 includes p-channel transistors MPT1, MPT2, and MPT3, as well as n-channel transistors MNT1, MNT2, and MNT3. A source of the transistor MPT1 is coupled to the supply node vcco. A drain of the transistor MPT1 is coupled to a source of the transistor MPT2. A drain of the transistor MPT2 is coupled to a source of the transistor MPT3. A drain of the transistor MPT3 is coupled to a drain of the transistor MNT1. A source of the transistor MNT1 is coupled to a drain of the transistor MNT2. A source of the transistor MNT2 is coupled to a drain of the transistor MNT3. A source of the transistor MNT3 is coupled directly to the ground node (gnd) or a reference node that is indirectly coupled to the ground node through an optional slew control circuit 516.

A gate of the transistor MPT1 is coupled to a node p_in. A gate of the transistor MNT3 is coupled to a node n_in. The nodes p_in and n_in are coupled to the output of the level-shifter 104. A gate of the transistor MPT2 is coupled to receive a bias voltage Pbias_tx. A gate of the transistor MNT2 is coupled to receive a bias voltage Nbias_tx. The bias voltages Pbias_tx and Nbias_tx are generated by the bias generation circuit 402 (FIG. 9). A gate of the transistor MPT3 is coupled to the source of the transistor MNT1. A gate of the transistor MNT1 is coupled to a source of the transistor MPT3. A node pgate_top is formed by the drain of the transistor MPT1 and the source of the transistor MPT2. The node pgate_top is coupled to the node 126 (i.e., the gate of the transistor MP_top in the driver 114). Transistors MPT2 and MNT2 protect the transistors MPT1 and MNT3, respectively, from high-voltage stress. The transistors MPT3 and MNT1 mitigate hot-carrier injection (HCI) degradation due to transistor switching. The slew control circuit 516 can be provided to control the slew of the inverter formed by the transistor stack 510.

The transmission gate 512 is coupled between the nodes p_in and n_in. The transmission gate 512 includes n-channel transistors MNT4 and MNT5 and p-channel transistors MPT4 and MPT5. Substrate terminals of the transistors MNT4 and MNT5 are coupled to the ground node gnd. Substrate terminals of the transistors MPT4 and MPT5 are coupled to the supply node vcco. For clarity, the substrate terminals of the other transistors (i.e., those not part of the transmission gates) are omitted from the drawing. It is to be understood that the substrate terminals of n-channel transistors can be connected to the ground node and substrate terminals of the p-channel transistors can be coupled to the supply node. One source/drain of the transistor MNT4 is coupled to the node p_in, and the other source/drain of the transistor MNT4 is coupled to a source/drain of the transistor MNT5. The other source/drain of the transistor MNT5 is coupled to the node n_in. Likewise, one source/drain of the transistor MPT4 is coupled to the node p_in, and the other source/drain of the transistor MPT4 is coupled to a source/drain of the transistor MPT5. The other source/drain of the transistor MPT5 is coupled to the node n_in. A gate of the transistor MNT4 is coupled to receive the bias voltage Nbias_tx. A gate of the transistor MNT5 is coupled to receive a control voltage en. A gate of the transistor MPT5 is coupled to receive the bias voltage Pbias_tx. A gate of the transistor MPT4 is coupled to receive a control voltage en_b_vcco. The control voltages en and en_b_vcco are generated by a control circuit (not shown). The control voltages en and en_b_vcco are logical inverses of each other, but with different voltage swings. In particular, the control voltage en is 0 V in HV mode and vcco in LV mode. The control voltage en_b_vcco is vcco in HV mode and 0 in LV mode.

The transmission gate 514 includes n-channel transistors MNT6 and MNT7. Substrate terminals of the transistors MNT6 and MNT7 are coupled to the ground node gnd. A source/drain of the transistor MNT6 is coupled to the node pgate_top, and the other source/drain of the transistor MNT6 is coupled to a source/drain of the transistor MN7. The other source/drain of the transistor MNT7 is coupled to a node formed by the source of the transistor MNT2 and the drain of the transistor MNT3. A gate of the transistor MNT6 is coupled to receive the bias voltage Nbias_tx. A gate of the transistor MNT7 is coupled to receive the control voltage en.

The transistors MNT4, MNT5, MPT4, and MPT5 function as switches. In the LV mode, the transistors MNT4 and MPT5 are biased on. Further, the control voltages en and en_b_vcco bias the transistors MNT5 and MPT4 on. Thus, the nodes p_in and n_in are common and swing between 0 and vcco. The output node pgate_top also swings from 0 to vcco with the help of transistors MNT6 and MNT7, each of which is biased on. In HV mode, the control voltages en and en_b_vcco bias the transistors MNT5 and MPT4 off. Thus, the nodes p_in and n_in are isolated by the transmission gate 512. Likewise, the transistors MNT7 is biased off and the node pgate_top is isolated from the source of the transistor MNT2 and the drain of the transistor MNT3. The node pgate_top swings from (vcco-1.8) to vcco. This ensures there are no reliability issues in the HV mode of operation. The node p_in swings from (vcco-1.8) to vcco. The node n_in swings from 0 to vccaux.

Figure 11:
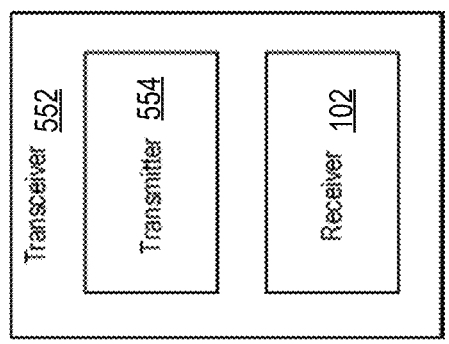
FIG. 11 shows a block diagram of an exemplary transceiver.

FIG. 11 shows a block diagram of an exemplary transceiver. The transceiver 552 includes the transmitter 554 and the receiver 102. The transmitter is constructed and operates as described above with respect to FIGS. 8-10. The receiver 102 is constructed and operates as described above with respect to FIGS. 1-6.

Figure 12:
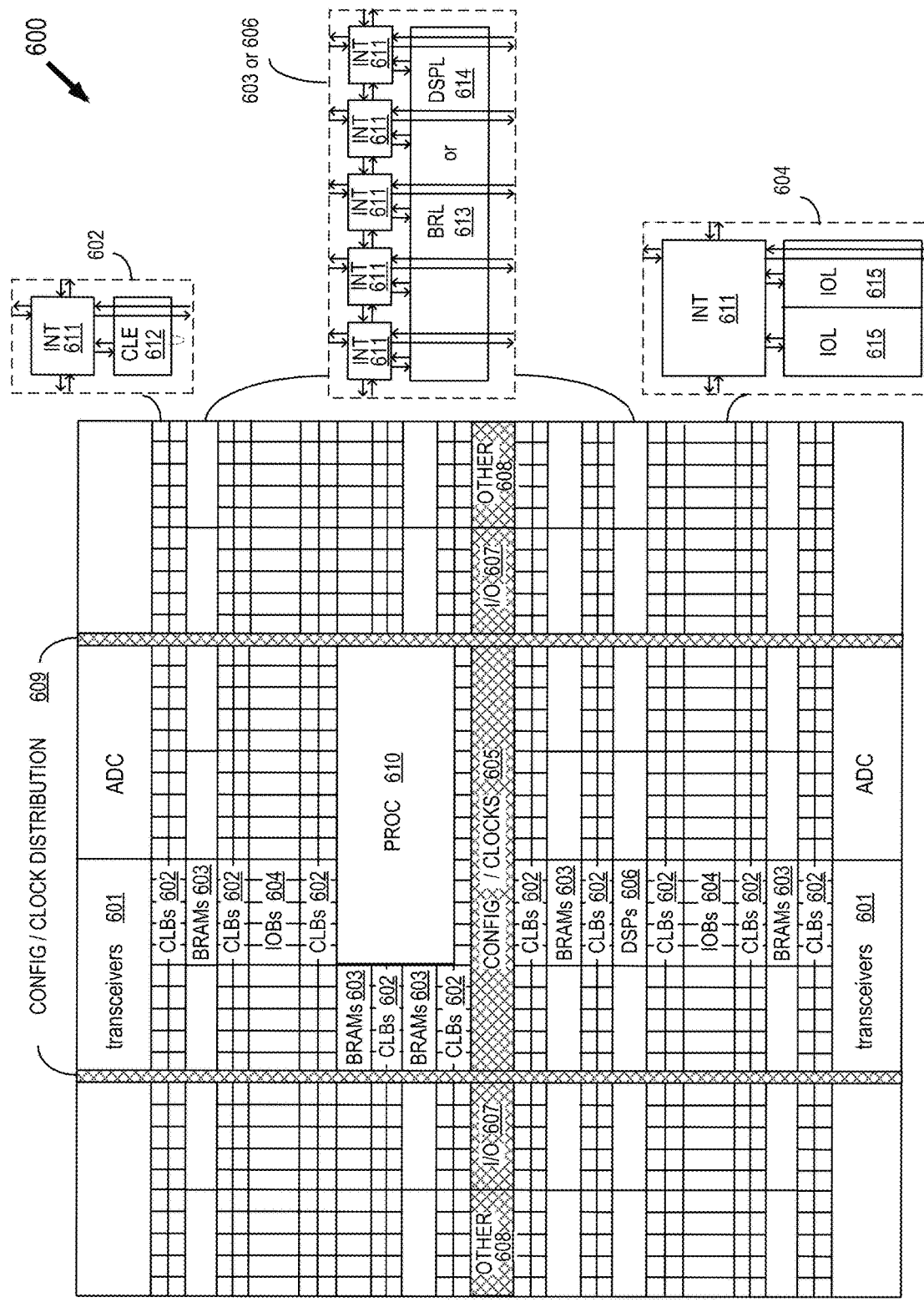
FIG. 12 shows a programmable integrated circuit (IC) on which the disclosed circuits can be implemented.

FIG. 12 shows a programmable integrated circuit (IC) 600 on which the disclosed circuits can be implemented. The programmable IC may also be referred to as a System On Chip (SOC) that includes field programmable gate array logic (FPGA) along with other programmable resources. FPGA logic may include several different types of programmable logic blocks in the array. For example, FIG. 6 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown). The disclosed circuitry can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 12) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 6 include additional logic blocks that disrupt the regular columnar structure making up a large part of the programmable IC. The additional logic blocks can be programmable blocks and/or dedicated logic. For example, the processor block PROC 610 shown in FIG. 12 spans several columns of CLBs and BRAMs.

Note that FIG. 12 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The circuits are thought to be applicable to a variety of transceivers. Other aspects and features will be apparent to those skilled in the art from consideration of the specification. It is intended that the specification and drawings be considered as examples only, with a true scope of the invention being indicated by the following claims.

What is claimed is:

1. A circuit arrangement comprising:
   a biasing circuit configured to generate a final pbias voltage, a final nbias voltage, and a sense signal in response to a supply voltage level, wherein:
   the final nbias voltage is greater than one half of the supply voltage level and less than a reliability limit, and the final pbias voltage is greater than a difference between the supply voltage level and the reliability limit and less than one-half the supply voltage level, in response to the supply voltage level being greater than the reliability limit,
   the final pbias voltage is pulled to ground level, and the final nbias voltage is pulled to the supply voltage level in response to the supply voltage level being less than the reliability limit, and
   a voltage level of the sense signal is less than the supply voltage level;
   a receiver that is controllable to operate in a first voltage mode that is greater than the reliability limit or operate in a second voltage mode that is less than the reliability limit, wherein the receiver is coupled to receive the final pbias voltage and the final nbias voltage; and
   a power-on-reset circuit coupled to receive the sense signal from the biasing circuit and configured to force output from the receiver to a constant logic value during ramp-up of the supply voltage.

2. The circuit arrangement of claim 1, wherein the biasing circuit includes:
   a first stage configured to generate an intermediate pbias voltage, an intermediate nbias voltage, and the sense signal, wherein:
   the intermediate pbias voltage is less than the supply voltage level,
   the intermediate nbias voltage is less than the supply voltage level and is less than the intermediate pbias voltage;
   a second stage including:
   a first p-type transistor having a source coupled to a supply voltage node and a gate coupled to the intermediate pbias voltage,
   a pbias node coupled between a ground level node and a drain of the first p-type transistor and configured to provide the final pbias voltage,
   a first n-type transistor having a source coupled to a ground level node and a gate coupled to the intermediate nbias voltage, and
   an nbias node coupled between the supply voltage node and a drain of the first n-type transistor and configured to provide the final nbias voltage.

3. The circuit arrangement of claim 2, wherein the voltage level of the sense signal is between the intermediate pbias voltage and the intermediate nbias voltage.

4. The circuit arrangement of claim 1, wherein the biasing circuit includes:
   a first stage coupled to receive the sense signal and configured to generate a master pbias voltage at a first voltage level in response to the supply voltage level being greater than the reliability limit and generate the master pbias voltage at the ground level in response to the supply voltage level being less than the reliability limit;
   a second stage configured to generate a sense-supply voltage and a sense-bias voltage, wherein:
   the sense-supply voltage and sense-bias voltage are less than the supply voltage level in response to the supply voltage level being above the reliability limit, and
   the sense-supply voltage and sense-bias voltage are equal to the supply voltage level in response to the supply voltage level being below the reliability limit; and
   a third stage configured to generate a sense-out signal that indicates whether the supply voltage level is suitable for operating the receiver in the first voltage mode or the second voltage mode, in response to the sense-supply voltage and the sense-bias voltage.

5. The circuit arrangement of claim 1, wherein the power-on-reset circuit includes a pulldown circuit that pulls output from the receiver to the constant logic value in response to assertion of a power-on-reset signal or the voltage level of the sense signal is less than a ramping threshold.

6. A circuit arrangement comprising:
   a biasing circuit configured to generate a pbias voltage and an nbias voltage in response to a supply voltage level, wherein:

the pbias voltage is greater than a difference between the supply voltage level and a reliability limit and less than one-half the supply voltage level, and the nbias voltage is greater than one-half the supply voltage level and less than the reliability limit in response to the supply voltage level being greater than the reliability limit, and the pbias voltage is greater than ground level and less than twice a gate-source threshold of a first p-type transistor providing the pbias voltage, and the nbias voltage is greater than twice a gate-source threshold of a first n-type transistor providing the nbias voltage and less than the supply voltage level in response to the supply voltage level being less than the reliability limit; and a transmitter that is controllable to operate in a first voltage mode that is greater than the reliability limit or a second voltage mode that is less than the reliability limit, wherein a driver of the transmitter is coupled to receive the pbias voltage and the nbias voltage.

7. The circuit arrangement of claim 6, wherein the biasing circuit includes:
a first stage configured to generate a control signal having a voltage level that is less than the supply voltage level;
a second stage including:
a p-type transistor having a source coupled to a supply voltage node and a gate coupled to the control signal,
a pbias node coupled between a ground level node and a drain of the p-type transistor and configured to provide the pbias voltage,
a n-type transistor having a source coupled to a ground level node and a gate coupled to the control signal, and
an nbias node coupled between the supply voltage node and a drain of the n-type transistor and configured to provide the nbias voltage.

8. The circuit arrangement of claim 7, wherein the voltage level of the control signal is less than of the supply voltage level.

9. The circuit arrangement of claim 6, wherein the transmitter includes a pre-driver coupled to receive the pbias voltage and the nbias voltage.

10. A circuit arrangement, comprising:
a first biasing circuit configured to generate a final pbias voltage, a final nbias voltage, and a sense signal in response to a supply voltage level, wherein:
the final nbias voltage is greater than one-half the supply voltage level and less than a reliability limit, and the final pbias voltage is greater than a difference between the supply voltage level and the reliability limit and less than one-half the supply voltage level, in response to the supply voltage level being greater than the reliability limit,
the final pbias voltage is pulled to ground level, and the final nbias voltage is pulled to the supply voltage level, in response to the supply voltage level being less than the reliability limit, and
a voltage level of the sense signal is less than the supply voltage level;
a receiver that is controllable to operate in a first voltage mode that is greater than the reliability limit or operate in a second voltage mode that is less than the reliability limit, wherein the receiver is coupled to receive the final pbias voltage and the final nbias voltage;
a power-on-reset circuit coupled to receive the sense signal from the biasing circuit and configured to force output from the receiver to a constant logic value during ramp-up of the supply voltage;
a second biasing circuit configured to generate a transmit-pbias voltage and a transmit-nbias voltage in response to the supply voltage level, wherein:
the transmit-pbias voltage is greater than a difference between the supply voltage level and the reliability limit and less than one-half the supply voltage level, and the transmit-nbias voltage is greater than one-half the supply voltage level and less than the reliability limit in response to the supply voltage level being greater than the reliability limit, and
the transmit-pbias voltage is greater than ground level and less than twice a gate-source threshold of a first p-type transistor providing the transmit-pbias voltage, and the transmit-nbias voltage is greater than twice a gate-source threshold of a first n-type transistor providing the transmit-nbias voltage and less than the supply voltage level in response to the supply voltage level being less than the reliability limit; and
a transmitter that is controllable to operate in the first voltage mode or the second voltage mode, wherein a driver of the transmitter is coupled to receive the transmit-pbias voltage and the transmit-nbias voltage.

11. The circuit arrangement of claim 10, wherein the first biasing circuit includes:
a first stage configured to generate an intermediate pbias voltage, an intermediate nbias voltage, and the sense signal, wherein:
the intermediate pbias voltage is less than the supply voltage level,
the intermediate nbias voltage is less than the supply voltage level and less than the intermediate pbias voltage; and
a second stage including:
a first p-type transistor having a source coupled to a supply voltage node and a gate coupled to the intermediate pbias voltage,
a pbias node coupled between a ground level node and a drain of the first p-type transistor and configured to provide the final pbias voltage,
a first n-type transistor having a source coupled to a ground level node and a gate coupled to the intermediate nbias voltage, and
an nbias node coupled between the supply voltage node and a drain of the first n-type transistor and configured to provide the final nbias voltage.

12. The circuit arrangement of claim 11, wherein the voltage level of the sense signal is between the intermediate pbias voltage and the intermediate nbias voltage.

13. The circuit arrangement of claim 10, wherein the first biasing circuit includes:
a first stage coupled to receive the sense signal and configured to generate a master pbias voltage at a first voltage level in response to the supply voltage level being greater than the reliability limit and generate the master pbias voltage at ground level in response to the supply voltage level being less than the reliability limit;
a second stage configured to generate a sense-supply voltage and a sense-bias voltage, wherein:
voltage levels of the sense-supply voltage and sense-bias voltage are less than the supply voltage level in response to the supply voltage level being above the reliability limit, and voltage levels of the sense-supply voltage and sense-bias voltage are equal to the supply voltage level in response to the supply voltage level being below the reliability limit; and a third stage configured to generate a sense-out signal that indicates whether the supply voltage level is suitable for operating the receiver in the first voltage mode or the second voltage mode, in response to the sense-supply voltage and sense-bias voltage.

14. The circuit arrangement of claim 10, wherein the power-on-reset circuit includes a pulldown circuit that pulls output from the receiver to the constant logic value in response to assertion of a power-on-reset signal or the voltage level of the sense signal is less than a ramping threshold.

15. The circuit arrangement of claim 10, wherein the second biasing circuit includes:
  a first stage configured to generate a control signal having a voltage level that is less than the supply voltage level; and
  a second stage including:
    a p-type transistor having a source coupled to a supply voltage node and a gate coupled to the control signal,
    a pbias node coupled between a ground level node and a drain of the p-type transistor and configured to provide the pbias voltage,
    a n-type transistor having a source coupled to a ground level node and a gate coupled to the control signal, and
    an nbias node coupled between the supply voltage node and a drain of the n-type transistor and configured to provide the nbias voltage.

16. The circuit arrangement of claim 15, wherein the voltage level of the control signal is one-half the supply voltage level.

17. The circuit arrangement of claim 10, wherein the transmitter includes a pre-driver coupled to receive the transmit-pbias voltage and the transmit-nbias voltage.

18. The circuit arrangement of claim 10, wherein:
the first biasing circuit includes:
  a receiver first stage configured to generate an intermediate pbias voltage, an intermediate nbias voltage, and the sense signal, wherein:
    the intermediate pbias voltage is less than the supply voltage level,
    the intermediate nbias voltage is less than the supply voltage level and less than the intermediate pbias voltage;
  a receiver second stage including:
    a first p-type transistor having a source coupled to a supply voltage node and a gate coupled to the intermediate pbias voltage,
    a first pbias node coupled between a ground level node and a drain of the first p-type transistor and configured to provide the final pbias voltage,
    a first n-type transistor having a source coupled to a ground level node and a gate coupled to the intermediate nbias voltage, and
    a first nbias node coupled between the supply voltage node and a drain of the first n-type transistor and configured to provide the final nbias voltage;
the second biasing circuit includes:
  a transmitter first stage configured to generate a control signal having a voltage level that is less than the supply voltage level;
a transmitter second stage including:
  a second p-type transistor having a source coupled to a supply voltage node and a gate coupled to the control signal,
  a second pbias node coupled between a ground level node and a drain of the second p-type transistor and configured to provide the pbias voltage,
  a second n-type transistor having a source coupled to a ground level node and a gate coupled to the control signal, and
  a second nbias node coupled between the supply voltage node and a drain of the second n-type transistor and configured to provide the nbias voltage.

19. The circuit arrangement of claim 18, wherein:
the voltage level of the sense signal is between the intermediate pbias voltage and the intermediate nbias voltage; and
the voltage level of the control signal is one-half the supply voltage level.

20. The circuit arrangement of claim 18, wherein:
the voltage level of the sense signal is between the intermediate pbias voltage and the intermediate nbias voltage; and
the power-on-reset circuit includes a pulldown circuit that pulls output from the receiver to the constant logic value in response to assertion of a power-on-reset signal or the voltage level of the sense signal is less than a ramping threshold.

\* \* \* \* \*